United States Patent
Hosoi et al.

(10) Patent No.: US 6,373,329 B2
(45) Date of Patent: Apr. 16, 2002

(54) BIAS CIRCUIT OF A BIPOLAR TRANSISTOR FOR HIGH FREQUENCY POWER AMPLIFICATION

(75) Inventors: Norio Hosoi, Yokohama; Hiroyuki Abe, Chigasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/734,590

(22) Filed: Dec. 13, 2000

(30) Foreign Application Priority Data

Dec. 14, 1999 (JP) .......................................... 11-354476

(51) Int. Cl.⁷ ................................................ G05F 3/02
(52) U.S. Cl. ...................... 327/538; 327/540; 327/541; 323/315
(58) Field of Search ............................... 327/538, 540, 327/541, 543; 323/313, 315

(56) References Cited

U.S. PATENT DOCUMENTS

| 3,875,430 A | * | 4/1975 | Prak ........................... 327/538 |
| 4,300,091 A | * | 11/1981 | Scade, Jr. ................... 327/541 |
| 4,884,161 A | * | 11/1989 | Atherton et al. ............ 323/313 |
| 5,757,226 A | * | 5/1998 | Yamada et al. ............. 327/541 |
| 6,016,074 A | * | 1/2000 | Yamamori ................... 327/541 |

FOREIGN PATENT DOCUMENTS

| JP | 63-240108 | 10/1988 |
| JP | 5-315537 | 11/1993 |

* cited by examiner

*Primary Examiner*—Terry D. Cunningham
(74) *Attorney, Agent, or Firm*—Oblon, Spivak, McClelland, Maier & Neustadt, P.C.

(57) ABSTRACT

There is disclosed a bias circuit of a bipolar transistor for the high frequency power amplification, and the bias circuit comprises a bipolar transistor for the temperature compensation, a resistor for the temperature compensation connected to a collector thereof, a field effect transistor, and a source resistor connected to a source thereof. The bias circuit comprises a two stage transistor circuit in which a connection point between the bipolar transistor and the resistor for the temperature compensation is connected to a gate of the field effect transistor, and an output voltage is taken out from a connection point between the source of the field effect transistor and the source resistor. In this bias circuit, the thermal runaway resulting from a temperature rise can be prevented, and a large high frequency output can be obtained in a non-linear operation region of the high frequency input power—output power characteristic.

12 Claims, 5 Drawing Sheets

BIAS CIRCUIT OF A BIPOLAR TRANSISTOR FOR HIGH FREQUENCY POWER AMPLIFICATION

CROSS-REFERENCE TO RELATED APPLICATIONS

This application is based upon and claims the benefit of priority from the prior Japanese Patent Application No. 11-354476, filed Dec. 14, 1999, the entire contents of which are incorporated herein by reference.

BACKGROUND OF THE INVENTION

The present invention relates to a bias circuit of a transistor, and more particularly to a base bias circuit of a bipolar transistor for the high frequency power amplification.

A structure of a conventional base bias circuit of a bipolar transistor will be explained by using FIG. 10. The conventional base bias circuit 5 shown in FIG. 10 comprises a diode Di for the temperature compensation connected in series, and a resistor R for the temperature compensation. A cathode of the diode Di for the temperature compensation is grounded, and an anode thereof is connected to one terminal of the resistor R for the temperature compensation, and a reference voltage Vref is applied to the other terminal of the resistor R for the temperature compensation.

Figure 10:
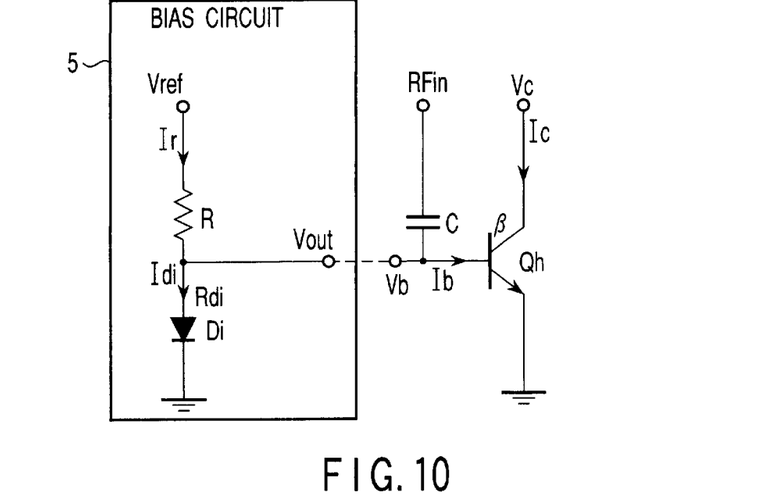
FIG. 10 is a circuit diagram showing a structure of a conventional bias circuit.

An output voltage Vout of the base bias circuit 5 is output from the connection point of the diode Di for the temperature compensation and a resistor R for the temperature compensation to supply a base voltage Vb and a base current Ib of a bipolar transistor Qh for the high frequency power amplification shown on the right side of FIG. 10.

An emitter of the bipolar transistor Qh for the high frequency power amplification is grounded and a collector voltage Vc is applied to a collector of the bipolar transistor Qh. A high frequency signal RFin is input to the base via a DC-cut capacitor, so that a base current Ib of the bipolar transistor Qh is modulated with this high frequency signal RFin.

The base current Ib which is high frequency modulated is amplified with the bipolar transistor Qh for the high frequency power amplification, and the amplified base current Ib modulates a collector current Ic at a large amplitude. A high frequency signal is output from the collector current Ic which is high frequency modulated via the output circuit. A structure of the output circuit for outputting the high frequency signal is not directly associated with the present invention, and the structure is omitted in FIG. 10.

Next, an operation of the bias circuit 5 shown in FIG. 10 will be explained. Here, there will be described a thermal runaway of the bipolar transistor for the high frequency power amplification which has conventionally become a problem besides, countermeasures thereof will be described as well. In order to obtain a high power high frequency signal by using the bipolar transistor, the collector current must be increased. However, when the collector current is increased, a large collector loss is generated. When the collector loss becomes large, a temperature of the bipolar transistor rises. When the temperature rises, the collector current increases. The increase in the collector current further increases the temperature of the bipolar transistor with the result that the collector current unusually increases and the bipolar transistor generates a thermal runaway.

The conventional bias circuit 5 shown in FIG. 10 is intended to suppress an increase in the collector current Ic of the bipolar transistor Qh for the high frequency power amplification resulting from the temperature rise by using the resistor R for the temperature compensation and the diode Di for the temperature compensation. A rise of current in the forward direction in the current voltage characteristic of the diode Di for the temperature compensation is shifted toward the side of the low voltage together with the temperature rise with the result that an equivalent resistance Rdi of the diode Di for the temperature compensation lowers together with the rise of the temperature.

On the other hand, the output voltage Vout of the bias circuit 5 can be obtained by dividing the reference voltage Vref with the equivalent resistance Rdi of the diode Di for the temperature compensation and the diode Di for the temperature compensation so that the output voltage Vout is lowered together with the temperature rise. With the lowering of the output voltage Vout, the base voltage Vb of the bipolar transistor Qh is lowered and the base current Ib decreases with the result that an increase in the collector current Ic resulting from the temperature rise is suppressed.

For preventing the thermal runaway, a method is conventionally used which comprises the steps of inserting the diode Di for the temperature compensation into the bias circuit of the bipolar transistor, and suppressing the increase in the collector current Ic resulting from the temperature rise. However, while this method is effective for the prevention of the thermal runaway, there arises a serious problem in that an increase in the output power Pout of a high frequency signal is suppressed with respect to the input power Pin of the high frequency signal RFin because a resistor R for the temperature compensation is inserted. It is the most important as the performance of the bipolar transistor Qh for the high frequency power amplification that the output power Pout of a high frequency signal is increased with respect to the input power Pin of the high frequency signal RFin.

When described in detail, the high frequency signal RFin is input and the bipolar transistor Qh for the high frequency power amplification is operated in a non-linear region of the high frequency input power—output power characteristic, the high frequency current which flows through the bipolar transistor Qh is subjected to a kind of rectifying action with the result that the base current Ib is increased as a result. When the bias circuit 5 shown in FIG. 10 is not connected to the bipolar transistor Qh for the high frequency power amplification, the increase in the base current Ib increases the collector current Ic so that the output saturation is alleviated which results from non-linear characteristic of the high frequency input power—output power characteristic of the bipolar transistor Qh for the high frequency power amplification and the high frequency output power characteristic so that an effect that the output power Pout of the high frequency signal is amplified can be obtained, which effect is extremely desirable for the high frequency power amplifier.

However, when the bias circuit 5 shown in FIG. 10 is connected to the bipolar transistor Qh for the high frequency power amplification, an increase in the base current Ib generated in the operation in a non-linear region of the high frequency input power—output power characteristic of the bipolar transistor Qh for the high frequency power amplification increases a current Ir which flows through a resistor R for the temperature compensation, so the output voltage Vout of the bias circuit 5 and the base voltage Vb of the bipolar transistor Qh for the high frequency power amplification are lowered. As a consequence, there arises a problem in that an increase in the output power Pout of the high frequency signal resulting from the operation in the non-linear region of the high frequency input power—output power characteristic of the bipolar transistor Qh for the high frequency power amplification is eliminated, which is a very serious problem that cannot be ignored as the high frequency power amplifier.

As described above, the conventional bias circuit of the bipolar transistor for the high frequency power amplification is effective for the prevention of the thermal runaway resulting from the temperature rise. On the other hand, however, there is a serious problem which cannot be ignored as the high frequency power amplifier such that an increase in the output power of the high frequency signal is eliminated which is based on a kind of rectifying action shown by the bipolar transistor for the high frequency power amplification in the operation in the non-linear region of the high frequency input power—output power characteristic.

BRIEF SUMMARY OF THE INVENTION

The present invention has been made in order to solve the problem, and an object of the invention is to provide a bias circuit of a bipolar transistor for the high frequency power amplification which does not eliminate an increase in an output power of a high frequency signal in a non-linear operation region of a high frequency input power—the high frequency output power characteristic while preventing, the thermal runaway resulting from the temperature rise.

The bias circuit of a transistor according to the present invention is characterized by comprising a circuit which is capable of conducting the temperature compensation without eliminating an increase in the base current at the time of inputting a high frequency signal when the bipolar transistor for the high frequency power amplification is operated in a non-linear region having a high frequency input power—output power characteristic.

According to a first aspect of the present invention, there is provided a bias circuit of a transistor comprising a first transistor, a second transistor, a first resistor and a second transistor, the first transistor being a bipolar transistor, the second transistor being a field effect transistor; wherein an emitter of the bipolar transistor is grounded; a collector and a base of the bipolar transistor are connected to each other, a connection point between this collector and the base are connected to one of the terminals of the first resistor; a control voltage is applied to the other terminal of the first resistor, and the connection point between the collector and the base of the bipolar transistor is connected to the gate of the field effect transistor; a source of the field effect transistor is connected to one terminal of the second resistor; the other terminal of the second resistor is grounded; a reference voltage is applied to the drain of the field effect transistor; and a bias voltage is output from the connection point between the source of the field effect transistor and one terminal of the second resistor.

In the bias circuit of a transistor according to the first aspect of the present invention, the field effect transistor may be a depletion type field effect transistor.

In the bias circuit of a transistor according to the first aspect of the present invention, the bipolar transistor may be an NPN transistor, and the field effect transistor may be an N-channel transistor. The field effect transistor may be a depletion type field effect transistor.

According to a second aspect of the present invention, there is provided a bias circuit of a transistor comprising a diode, a transistor, and a first and a second resistor; wherein the transistor is a field effect transistor; a cathode of the diode is grounded; an anode of the diode is connected to one terminal of the first resistor; the control voltage is applied to the other terminal of the first resistor; a connection point between the anode of the diode and one terminal of the first resistor is connected to the gate of the field effect transistor; the collector and the base of the bipolar transistor are connected to each other, and a connection point between the collector and the base is connected to one terminal of the first resistor; a control voltage is applied to the other terminal of the first resistor; a connection point between the anode of the diode and one terminal of the first resistor is connected to the gate of the field effect transistor; a source of the field effect transistor is connected to one terminal of the second resistor; the other terminal of the second resistor is grounded; a reference voltage is applied to a drain of the field effect transistor; and a bias voltage is output from the connection point between the source of the field effect transistor and one terminal of the second resistor.

In the bias circuit of a transistor according to the second aspect of the present invention, the field effect transistor may be a depletion type field effect transistor.

In the bias circuit a transistor according to the second aspect of the present invention, the field effect transistor may be an N channel transistor. The field effect transistor may be a depletion type field effect transistor.

According to a third aspect of the present invention, there is provided a bias circuit of a transistor comprising a first transistor and a second transistor, a first resistor and a second resistor, the first transistor being a bipolar transistor, the second transistor being a bipolar transistor: wherein an emitter of the bipolar transistor constituting a first transistor is grounded; a collector and a base of a bipolar transistor constituting a first transistor are connected to each other, and a connection point between this collector and the base is connected to one terminal of the first resistor; a control voltage is applied to the other terminal of the first resistor; a connection point between the collector and the base of the bipolar transistor constituting the first transistor is connected to a base of the bipolar transistor constituting the second transistor; an emitter of the bipolar transistor constituting the second transistor is connected to one terminal of the second resistor; the other terminal of the second resistor is grounded; a reference voltage is applied to the collector of the bipolar transistor constituting the second transistor; and a bias voltage is output from the connection point between the emitter of the bipolar transistor constituting the second transistor and one terminal of the second resistor.

In the bias circuit of a transistor according to the third aspect of the present invention, the bipolar transistor constituting the first transistor may be an NPN transistor, and the bipolar transistor constituting the second transistor may be the NPN transistor.

According to a fourth aspect of the present invention, there is provided a bias circuit of a transistor comprising a diode, a bipolar transistor, a first resistor and a second resistor: wherein a cathode of the diode is grounded; an anode of the diode is connected to one terminal of the first resistor; a control voltage is applied to the other terminal of the first resistor; a connection point between the anode of the diode and the first resistor is connected to a base of the bipolar transistor; an emitter of the bipolar transistor is connected to one terminal of the second resistor; the other terminal of the second resistor is grounded; a reference voltage is applied to the collector of the bipolar transistor; and a bias voltage is output from the connection point between the emitter of the bipolar transistor and one terminal of the second resistor.

In the bias circuit of a transistor according to the fourth aspect of the present invention, the bipolar transistor may be an NPN transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained in detail by referring to the drawings hereinbelow.

Figure 1:
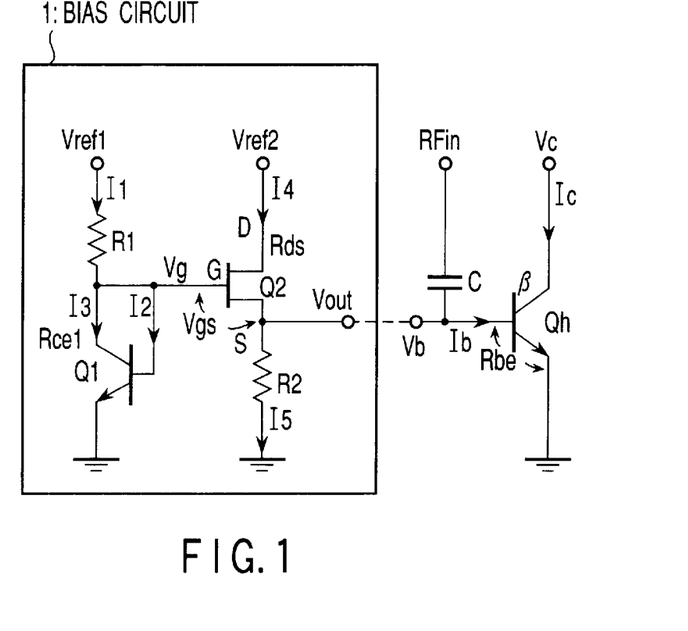
FIG. 1 is a circuit diagram showing a structure of a bias circuit according to a first embodiment of the present invention.

FIG. 1 is a circuit diagram showing a structure of a bias circuit of a bipolar transistor for the high frequency power amplification according to a first embodiment of the present invention. A bias circuit 1 of the present invention shown in FIG. 1 comprises a bipolar transistor Q1 for the temperature compensation, a resistor R1 for the temperature compensation, a field effect transistor Q2, and a source bias resistor R2 of the field effect transistor Q2.

An emitter of the bipolar transistor Q1 for the temperature compensation is grounded, and a base and a collector are connected to one of terminals of the resistor R1 for the temperature compensation, and a control voltage Vref1 is applied to the other terminal of the resistor R1 for the temperature compensation. A connection point between the base and the collector of the bipolar transistor Q1 for the temperature compensation and one terminal of the resistor R1 for the temperature compensation is connected to a gate of the field effect transistor Q2, and the source of the field effect transistor Q2 is grounded via a source bias resistor R2.

A reference voltage Vref2 is applied to a drain of the field effect transistor Q2. An output voltage Vout of the bias circuit 1 is taken out from the connection point between the source of the field effect transistor Q2 and the source bias resistor R2. The output voltage Vout is connected to the base of the bipolar transistor Qh for high frequency power amplification shown on the right side of FIG. 1 to supply a base voltage Vb and a base current Ib.

An emitter of the bipolar transistor Qh for high frequency power amplification is grounded, and a collector voltage Vc is applied to the collector. A high frequency signal RFin is input to the base via a DC-cut capacitor C. A base current Ib of the bipolar transistor Qh is modulated with this high frequency signal RFin.

The high frequency modulated base current Ib is current amplified at the bipolar transistor Qh for the high frequency power amplification. Then the current amplified base current Ib modulates the collector current Ic at a large amplitude. A high frequency signal is output from the collector current Ic which is high frequency modulated, via the output circuit. The structure of the output circuit for outputting a high frequency signal is not directly associated with the present invention. Thus, the structure is omitted in FIG. 1.

Next, an operation of the bias circuit 1 of the present invention shown in FIG. 1 will be explained.

Current which flows through the resistor R1 for the temperature compensation of the bias circuit 1 is denoted by reference numeral I1, a base current of the bipolar transistor Q1 for the temperature compensation is denoted by reference numeral I2, a collector current is denoted by reference numeral I3, a drain current of the field effect transistor is denoted by reference numeral I4, and a current of the source bias resistor R2 is denoted by reference numeral I5.

When the current amplification factor of the bipolar transistor Qh for the high frequency power amplification is set to $\beta$, the relation of $Ib=Ic/\beta$ is established between the base current Ib and the collector current Ic. Furthermore, the base voltage Vb is a voltage applied to the base to allow the base current Ib to flow. All of these voltages are defined as a quantity which depends only on the characteristic of the bipolar transistor Qh for the high frequency power amplification irrespective of the outside circuit structure.

Furthermore, it is assumed that a resistor between the base and the emitter of the bipolar transistor Qh for the high frequency power amplification is set to Rbe and a resistor between the drain and the source of the field effect transistor Q2 is set to Rds. The reference voltage Vref2 may be divided by using a parallel resistor comprising a source bias resistor R2 and a resistor Rbe between the base and the emitter and a voltage divider comprising a resistor Rds between the base and the emitter in order to set the output voltage Vout of the bias circuit 1 equal to the base voltage Vb of the bipolar transistor Qh for the high frequency power amplification.

Since the output voltage Vout of the bias circuit 1 can be controlled to some extent with the control voltage Vref1, the voltage division ratio can be determined for setting Vout equal to Vb only with the resistor Rds between the drain and the source and the source resistor R2 by allowing Rbe>>R2 to be established.

When the high frequency signal RFin is input, and the bipolar transistor Qh for the high frequency power amplification is operated in a non-linear region of the high frequency input power—output power characteristic by using the bias circuit 1, a voltage Vgs between the gate and the source of the field effect transistor Q2 and a voltage Vds between the drain and the source change in accordance with the input signal level. Consequently, in order to maintain constant the function which supplies the base current to the bipolar transistor Qh for the high frequency power amplification, the operation point of the field effect transistor Q2 is set to the current saturation region (the region where the resistor Rds between the drain and the source does not change even when the operation point somewhat changes). Furthermore, it goes without saying that the field effect transistor Q2 requires a sufficient gate width for supplying the base current flowing through the bipolar transistor Qh for the high frequency power amplification in the non-linear region of the high frequency input power—output characteristic.

The temperature characteristic of the bipolar transistor Q1 for the temperature compensation is equal to the temperature characteristic of the bipolar transistor Qh for the high frequency power amplification, and at the same time, the gate voltage Vg=Vgs+Vb of the field effect transistor Q2 is set to the current saturation region. The gate voltage Vg is set by resistor-dividing the control voltage Vref1 with the resistor R1 for the temperature compensation and a resistor Rce1 between the collector and the emitter of the bipolar transistor Q1 for the temperature compensation. At this time, there is provided an advantage in that when a depletion type field effect transistor is used as the field effect transistor Q2, the control voltage Vref1 can be set to a low voltage scope from 0V to Vb. The operation of the bias circuit 1 in the first embodiment will be as conducted as follows.

In the previous description, referring to FIG. 10 an explanation is made that an increase in the base current $1b$ generated in the operation in the non-linear region of the high frequency input power—output characteristic increases the current Ir which flows through the resistor R for the temperature compensation with the result that the base voltage Vb is lowered, and the increase in the base current Ib generated in the operation in the non-linear region of the high frequency input power—output power characteristic is eliminated.

However, when the bias circuit 1 of the present invention shown in FIG. 1 is used, an increase in the base current Ib increases the current I4 which flows through the resistor Rds between the drain and the source of the field effect transistor Q2, so that the base voltage Vb is lowered with the increase in this current I4 with the result that the increase in the base current Ib generated in the operation in the non-linear region of the high frequency input power—output power characteristic is about to be eliminated. In such a situation, the voltage Vgs between the gate and the source of the field effect transistor Q2 becomes large with the lowering of the base voltage Vb (=Vout), and the drain current I4 increases, so that the base current Ib which is about to be eliminated is compensated, which leads to avoid a phenomenon in which the increase in the base current Ib generated in the operation in the non-linear region of the high frequency input power—output power characteristic is eliminated with the resistor Rds between the drain and the source.

Furthermore, when the temperature rises, the base current Ib and the collector current Ic of the bipolar transistor Qh for the high frequency power amplification increases so that the danger of thermal runaway is generated. However, at this time, the base current I2 and the collector current I3 of the bipolar transistor Q1 for the temperature compensation shown in FIG. 1 also increase, so that the current I1 which flows through the resistor R1 for the temperature compensation increases. Consequently, the gate voltage Vg of the field effect transistor Q2 lowers and the drain current I4 decreases. The decrease in the drain current I4 decreases the base current Ib of the bipolar transistor Qh for the high frequency power amplification and suppresses the increase in the current Ib resulting from the temperature rise thereby making it possible to prevent the thermal runaway of the bipolar transistor Qh for the high frequency power amplification resulting from the increase in the collector current Ic.

Next, a second embodiment of the present invention will be explained by referring to FIG. 2. A bias circuit 2 in the second embodiment can be obtained by replacing the bipolar transistor Q1 for the temperature compensation in the bias circuit 1 in the first embodiment with a diode Di for the temperature compensation. An anode of the diode Di for the temperature compensation is connected to one terminal of the resistor R1 for the temperature compensation and the gate of the field effect transistor Q2. A cathode of the diode Di for the temperature compensation is grounded. An operation of the bias circuit 2 according to the second embodiment will be conducted in the following manner.

In the same manner as the first embodiment, an increase in the base current Ib generated in the operation in the non-linear region of the high frequency input power—output power of the bipolar transistor for the high frequency power amplification increases the current I4 which flows through the resistor Rds between the drain and the source of the field effect transistor Q2 so that the base voltage Vb is lowered with the increase in this current I4 with the result that the increase in the base current Ib generated in the operation in the non-linear region of the high frequency input power—output power characteristic is about to be eliminated. In such a situation, the voltage Vgs between the gate and the source of the field effect transistor Q2 becomes large with the lowering of the base voltage Vb (=Vout), and the drain current I4 increases, so that the base current Ib is compensated. Therefore, a phenomenon can be avoided in which the increase in the base current Ib generated in the operation in the non-linear region of the high frequency input power—output power characteristic is eliminated.

When the temperature rises, an equivalent resistance Rdi of the diode Di for the temperature compensation decreases, and the gate voltage Vg of the field effect transistor Q2 is lowered, so that the drain current I4 of the field effect transistor Q2 decreases. The decrease in the drain current I4 decreases the base current Ib of the bipolar transistor Qh for the high frequency power amplification and an increase of Ib resulting from the temperature rise is suppressed thereby making it possible to prevent the thermal runaway of the bipolar transistor Qh for the high frequency power amplification resulting from the increase in the collector current Ic generated in the temperature rise.

Figure 3:
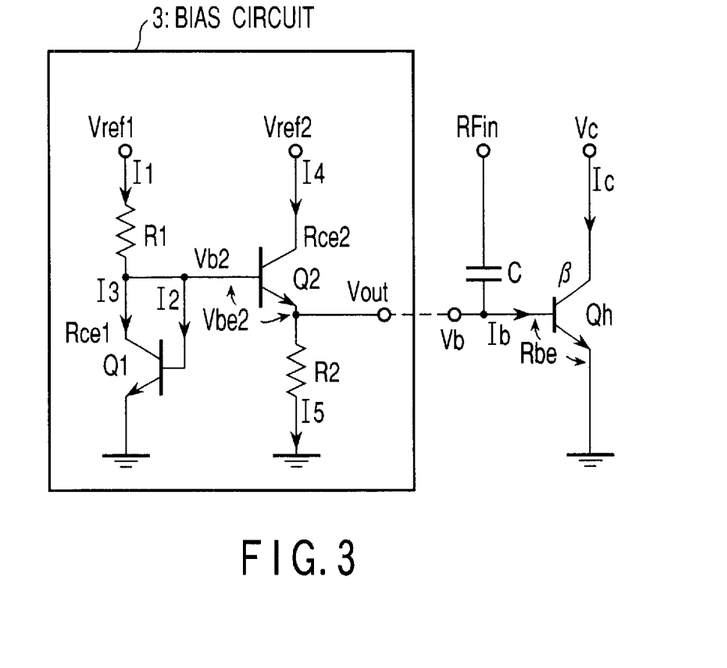
FIG. 3 is a circuit diagram showing a structure of a bias circuit according to a third embodiment of the present invention.

Next, a third embodiment of the present invention will be explained by using FIG. 3. A bias circuit 3 in the third embodiment can be obtained by replacing the field effect transistor Q2 of the bias circuit 1 in the first embodiment with the bipolar transistor Q2. The base of the bipolar transistor Q2 is connected to a connection point of the base and the collector of the bipolar transistor Q1 for the temperature compensation and one terminal of the resistor R1 for the temperature compensation. A reference voltage Vref2 is applied to the collector of the bipolar transistor Q2, so that an output voltage Vout of the bias circuit 3 is taken out from the connection point between the emitter of the bipolar transistor Q2 and the emitter bias resistor R2. The output voltage Vout is connected to the base of the bipolar transistor Qh for the high frequency power amplification shown on the right side of FIG. 1, so that the base voltage Vb and the base current Ib are supplied. An operation of the bias circuit 3 according to the third embodiment will be conducted in the following manner.

An increase in the base current Ib generated in the operation in the non-linear region of the high frequency input power—output power characteristic of the bipolar transistor Qh for the high frequency power amplification increases the collector current I4 which flows through a resistor Rce2 between the collector and the emitter of the bipolar transistor Q2, so that the base voltage Vb is lowered with the result that the increase in the base current Ib generated in the operation in the non-linear region of the high-frequency output power characteristic is to be eliminated. In such a situation, a voltage Vbe2 between the base and the emitter of the field effect transistor Q2 becomes large with the lowering of the base voltage Vb, and the collector current I4 increases, so that the base current Ib is compensated, which leads to avoid a phenomenon in which the increase in the base current Ib generated in the operation in the non-linear region of the high frequency input power—output power characteristic is eliminated with the resistor Rce2 between the collector and the emitter.

Furthermore when the temperature rises, the base current I2 and the collector current I3 of the bipolar transistor Q1 for the temperature compensation increases, so that the current I1 which flows through the resistor R1 for the temperature compensation increases. Consequently, the base voltage Vb2 of the bipolar transistor Q2 is lowered, and the voltage Vbe2 between the base and the emitter becomes small, and the collector current I4 of the bipolar transistor Q2 decreases. This decrease in the drain current I4 decreases the base current Ib of the bipolar transistor Qh for the high frequency power amplification with the temperature rise thereby making it possible to prevent the thermal runaway.

In the third embodiment, it is necessary to use the bipolar transistor Qh for the high frequency power amplification and the bipolar transistor Q1 for the temperature compensation having approximately the same temperature characteristic. Consequently, as a condition for operating the circuit shown in FIG. 3, the bipolar transistor Q2 must be used which has a small built-in voltage of the junction between the emitter and the base as compared with Qh and Q1.

For example, when a GaAs HBT (Hetero bipolar transistor) is used as Qh and Q1, then a silicon bipolar transistor formed of a material having physical properties different from a material of the GaAs HBT is used as Q2, so that the built-in voltage of the junction between the emitter and the base is small. When a silicon bipolar transistor is used as Qh, Q1 and Q2, a resistor must be inserted into at least one of the base, the collector and the emitter of Q1 in the circuit shown in FIG. 3.

Figure 4:
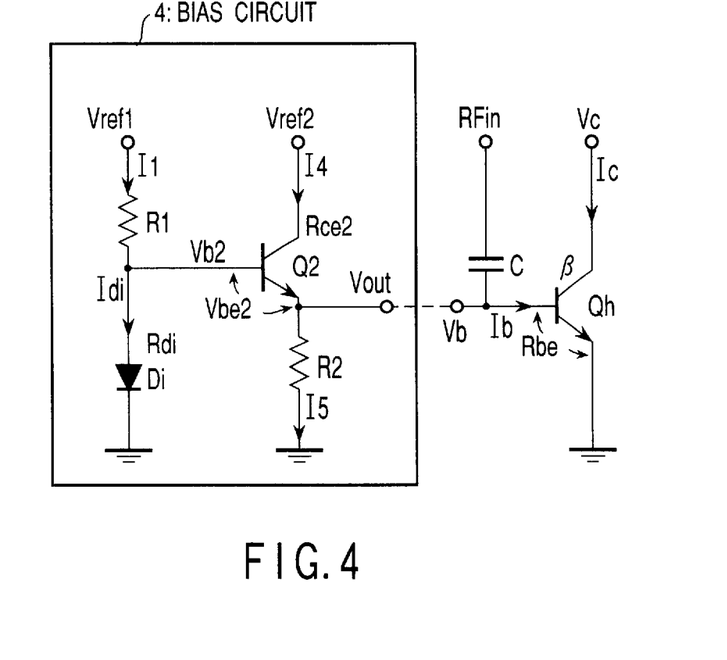
FIG. 4 is a circuit diagram showing a structure of a bias circuit according to a fourth embodiment of the present invention.

Next, a fourth embodiment of the present invention will be explained by using FIG. 4. A bias circuit 4 in the fourth embodiment can be obtained by replacing the field effect transistor Q2 of the bias circuit 1 in the first embodiment with the bipolar transistor Q2 and replacing the bipolar transistor Q1 for the temperature compensation with the diode Di for the temperature compensation. An anode of the diode Di for the temperature compensation is connected to one terminal of the resistor R1 for the temperature compensation and the base of the bipolar transistor Q2. A cathode of the diode Di for the temperature compensation is grounded.

A reference voltage Vref2 is applied to the collector of the bipolar transistor Q2, and an output voltage Vout of the bias circuit 4 is taken out from the connection point between the emitter of the bipolar transistor Q2 and the emitter bias resistor R2. The output voltage Vout is connected to the base of the bipolar transistor Qh for the high frequency power amplification shown on the right side of FIG. 4 to supply the base voltage Vb and the base current Ib. An operation of the bias circuit 4 according to the fourth embodiment will be conducted in the following manner.

In the same manner as the third embodiment, an increase in the base current Ib generated in the operation in the non-linear region of the high frequency input power—output power characteristic of the bipolar transistor Qh for the high frequency power amplification increases the collector current I4 which flows through the resistor Rce2 between the collector and the emitter of the field effect transistor Q2, so that the base voltage Vb is lowered with the result that the increase in the base current Ib generated in the operation in the non-linear region of the high frequency input power—output power characteristic is to be eliminated. In such a situation, the voltage Vbe2 between the base and the emitter of the bipolar transistor Q2 becomes large with the lowering of the base voltage Vb, and the collector current I4 increases, so that the base current Ib is compensated, which leads to avoid a phenomenon in which the increase in the base current Ib generated in the operation in the non-linear region of the high-frequency input power—output power characteristic is eliminated.

Furthermore when the temperature rises, an equivalent resistance Rdi of the diode Di for the temperature compensation decreases, the base voltage Vb2 of the bipolar transistor Q2 is lowered, and the voltage Vbe2 between the base and the emitter becomes small, so that the collector current I4 of the bipolar transistor Q2 decreases. The decrease in the collector current I4 decreases the base current Ib of the bipolar transistor Qh for the high frequency power amplification, so that an increase of Ib resulting from the temperature rise is suppressed thereby making it possible to prevent the thermal runaway of the bipolar transistor Qh for the high frequency power amplification resulting from the increase in the collector current Ic.

In the fourth embodiment, it is necessary to use the bipolar transistor Qh for the high frequency power amplification and the diode Di for the temperature compensation having approximately the same temperature characteristic. Consequently, as a condition for operating the circuit shown in FIG. 4, the built-in voltage of the junction between the emitter and the base of the bipolar transistor Q2 must be smaller than the built-in voltage of the junction between the emitter and the base of the bipolar transistor Qh for the high frequency amplification and the built-in voltage of the junction of the diode Di for the temperature compensation.

For example, when a hetero bipolar transistor and a hetero diode are used respectively as Qh and Di, then a silicon bipolar transistor formed of material having physical properties different from a material of the hetero bipolar transistor and the hetero diode is used as Q2. When silicon is used as Qh, Di and Q2, a resistor must be inserted into either of the anode and the cathode of Di in the circuit shown in FIG. 4.

Next, a fifth embodiment of the present invention will be explained by using FIGS. 5 through 9. In the fifth embodiment, there will be compared with each other and explained the operation characteristic of the transistor Qh for the high frequency power amplification in the case where the output voltage Vout of the bias circuit 1 in the first embodiment is applied as the base voltage Vb, an operation characteristic in the case where the base voltage Vb is set to the constant voltage, and an operation characteristic in the case where the output voltage Vout of the conventional bias circuit 5 is applied as the base voltage Vb. The operation characteristic of the second to the fourth embodiments is conceptually the same as the operation characteristic of the first embodiment, so that a detailed explanation thereof is omitted.

Figure 5:
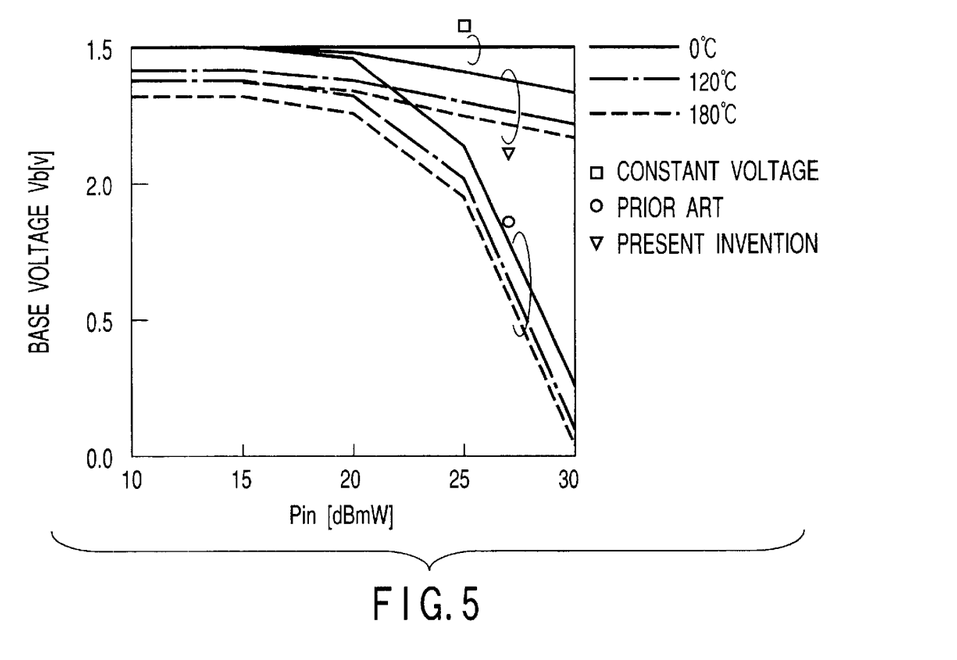
FIG. 5 is a characteristic curve graph showing a dependency of a base voltage Vb on a high frequency input power Pin.

FIG. 5 shows a dependency of the base voltage Vb on the input power Pin of the transistor Qh for the high frequency power amplification. Hereinafter, in FIGS. 5 through 9, the frequency used in the simulation is 1.8 GHz in all the cases. The input power on the abscissa is a value of the input power Pin represented in the logarithm scale. The simulation results at 0° C., 120° C. and 180° C. are shown by a solid line, a one dot chain line and a broken line, respectively. A square mark denotes a simulation result in a case where the base voltage Vb is connected to the constant voltage source, a round mark denotes a case where the base voltage Vb is connected to the conventional bias circuit 5 shown in FIG. 10, and a triangle mark denotes a simulation result in the case where the base voltage Vb is connected to the bias circuit 1 of the present invention shown inn FIG. 1.

Up to 15 of the numeric value on the abscissa, the base voltage Vb is constant irrespective of the input power Pin in all the cases described above. It is shown that when the numeric value on the abscissa exceeds 15, the base voltage Vb in the conventional example is largely lowered with an increase in the input power Pin, and the influence of the lowering of the Vb resulting from the resistor R for the temperature compensation is large. On the other hand, in the case of the present invention, the lowering of the base voltage Vb is small and a result can be obtained which is close to the case in which the base voltage Vb is connected to the constant voltage source.

From the above fact, as described in the first embodiment, it can be seen that the lowering of the base voltage Vb in the operation in the non-linear region of the high frequency input power—output power characteristic of the transistor Qh for the high frequency power amplification can be avoided with the action of the field effect transistor Q2 when the bias circuit 1 shown in FIG. 1 is used.

Figure 6:
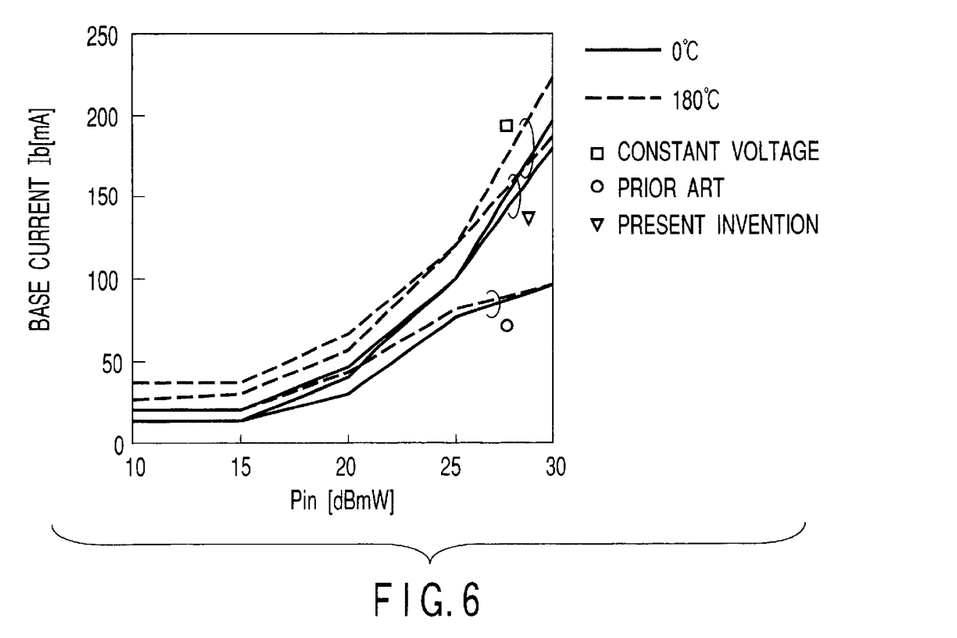
FIG. 6 is a characteristic curve graph showing a dependency of a base current Ib on a high frequency input power Pin.

Next, FIG. 6 shows a dependency of the base current Ib of the transistor Qh for the high frequency power amplification on the input power Pin of the high frequency signal. The simulation results at 0° C. and 180° C. are denoted by a solid line and a broken line, respectively. Corresponding to the lowering of the Vb explained in FIG. 5, it can be seen that in the case of the prior art, an increase in the base current Ib generated in the operation in the non-linear region of the frequency input power—output power characteristic is eliminated, while in the case of the present invention, an increase in the base current Ib generated in the operation in the non-linear region of the high frequency input power—output power characteristic of the transistor Qh for the high frequency power amplification comes approximately close to the case in which the base voltage Vb is connected to the constant voltage source.

Figure 7:
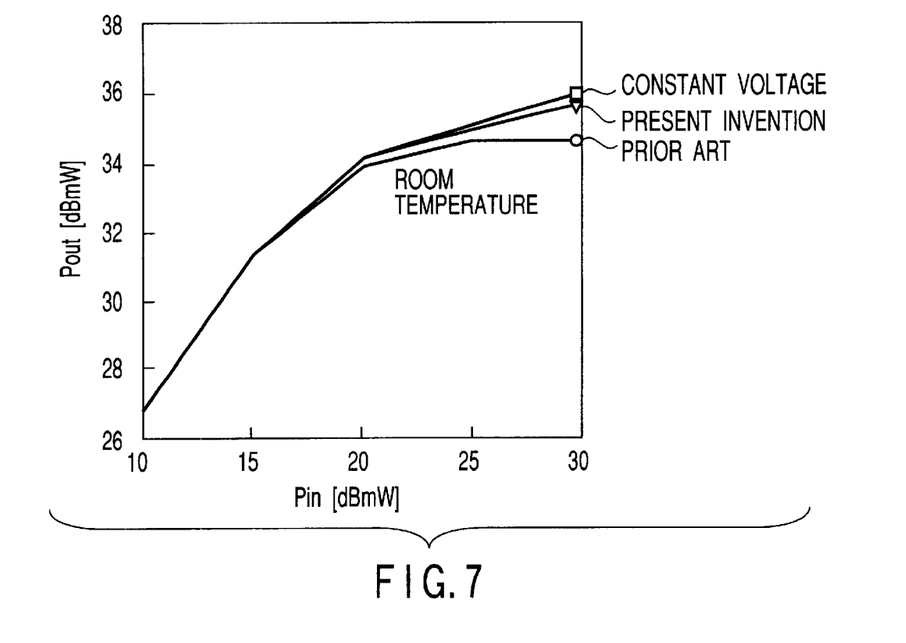
FIG. 7 is a characteristic curve graph showing a dependency of a high frequency output power Pout on a high frequency input power Pin.

Next, FIG. 7 shows a dependency of the output power Pout of the high frequency signal on the input power Pin. The simulated temperature is all set to room temperature. Corresponding to the result in FIGS. 5 and 6, it can be seen that in the prior art, an increase in the output power Pout with respect to the input power Pin is suppressed in the operation in the non-linear region of the high frequency input power—output power characteristic, while in the case of the present invention, the value of the output power Pout comes close to the value close to the case of being connected to the constant voltage source.

Figure 8:
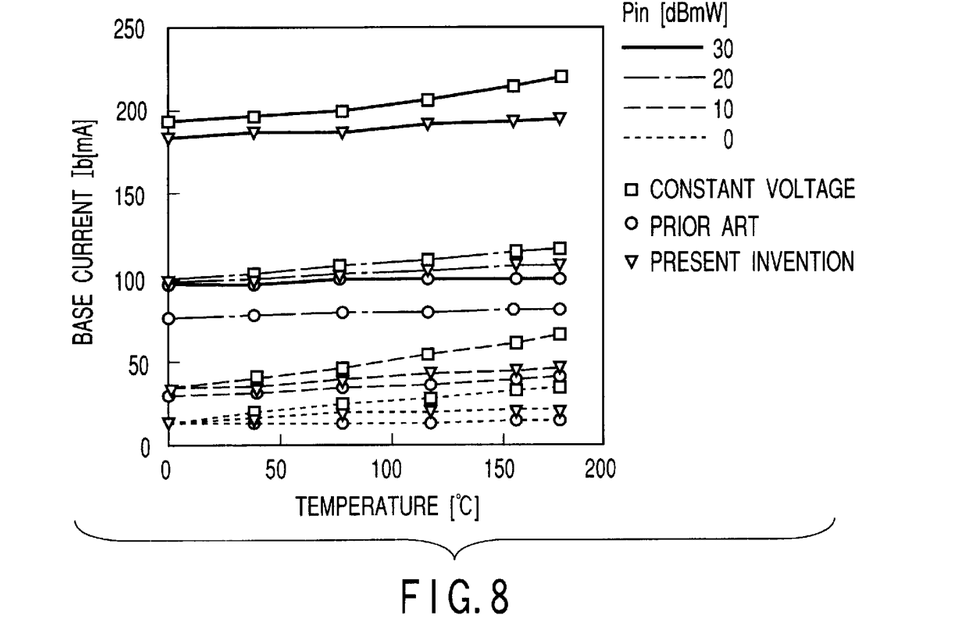
FIG. 8 is a characteristic curve graph showing a temperature dependency of the base current Ib.

Next, there will be explained an effect of preventing the thermal runaway with respect to the transistor Qh for the high frequency power amplification of the bias circuit 1 of the present invention by using FIGS. 8 and 9. FIG. 8 shows a temperature dependency of the base current Ib. A parameter of the simulation is the input power Pin. It is possible to discern the tendency of an increase in the base current Ib along with the input power Pin corresponding to FIG. 6.

When the bias circuit 1 of the present invention is used, the base current Ib can be obtained which has a value close to the base current Ib approximately in the case of the constant voltage when the input power Pin is set to be large. However, it can be seen that the degree of the increase resulting from the temperature rise is small as compared with the case of the constant voltage, so that the thermal runaway is suppressed. In the prior art, it can be seen that the temperature characteristic is planar and the effect of preventing the thermal runaway is large whereas the base current Ib is small, and an increase in the base current Ib in the operation in the non-linear region of the high frequency input power—output power characteristic is eliminated.

Figure 9:
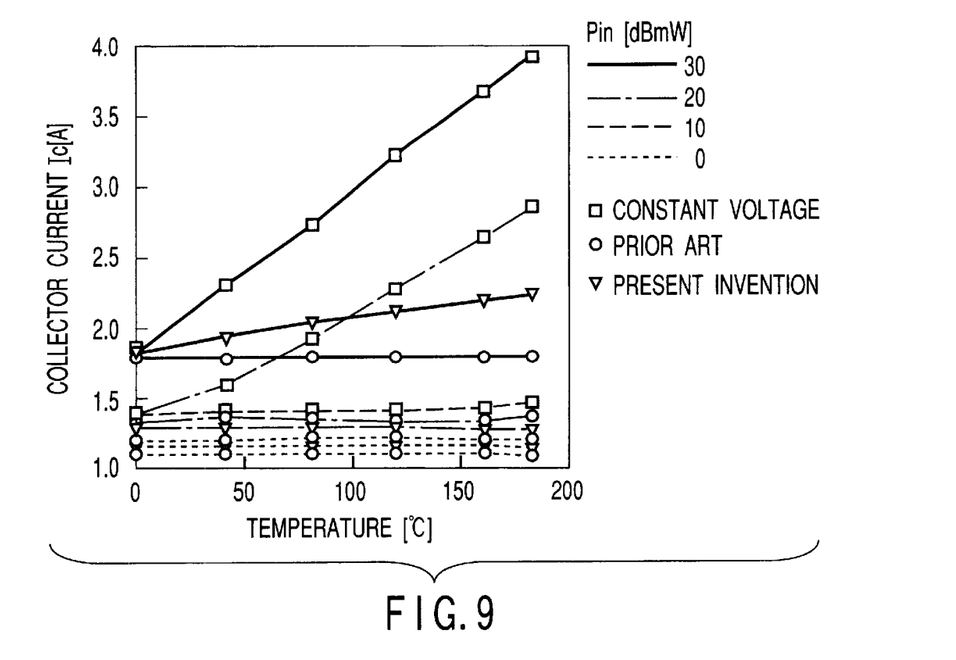
FIG. 9 is a characteristic curve graph showing a temperature dependency of a collector current Ic.

FIG. 9 shows a temperature dependency of the collector current Ic. As has been explained before, the temperature change of the collector current Ic more directly affects the thermal runaway of the transistor Qh for the high frequency power amplification as compared with the base current Ib. In the case where the base voltage is connected to the constant voltage source, the collector current Ic conspicuously increases with the temperature rise so that the possibility of occurrence of the thermal runaway is high. In the case of the present invention, mild temperature greatly of the collector current Ic close to the prior art can be obtained, so that there is no possibility that the thermal runaway is generated. A characteristic curve with regard to the constant voltage when the input power Pin is 0 [dBmW] is omitted in FIG. 9, since the characteristic curve when the input power Pin is 0 [dBmW] almost overlaps with the characteristic curve of the constant voltage when the input power Pin is 10 [dBmW]. Similarly, a characteristic curve with regard to the present invention when the input power Pin is 0 [dBmW] is omitted in FIG. 9, since the characteristic curve when the input power Pin is 0 [dBmW] almost overlaps with the characteristic curve of the present invention when the input power Pin is 10 [dBmW].

Incidentally, the present invention is not restricted to the above embodiments. For example, in the first and the second embodiments, there has been explained a case in which a depletion type field effect type transistor is used as the field effect transistor Q2. However, the present invention is not necessarily restricted thereto. When the value of the control voltage Vref1 is set to a high value, an enhancement type field effect transistor can be also used in the same manner.

Figure 2:
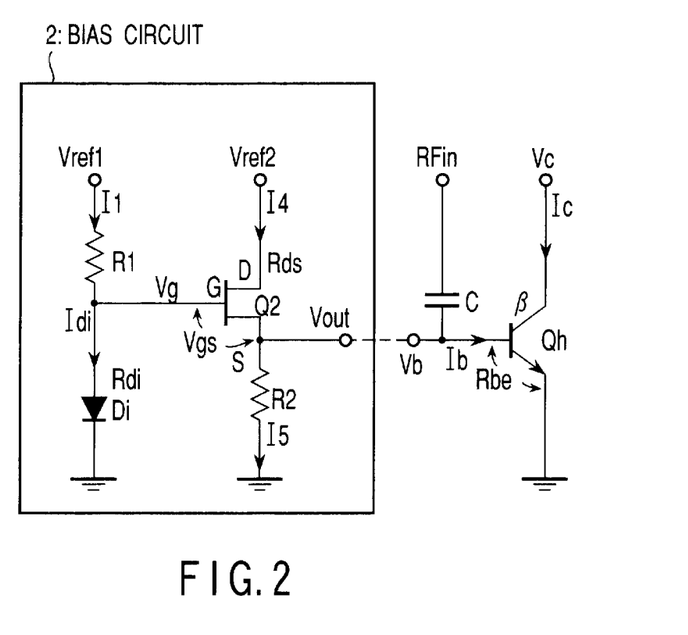
FIG. 2 is a circuit diagram showing a structure of a bias circuit according to a second embodiment of the present invention.

Furthermore, in FIGS. 1 and 2, the field effect transistor Q2 is illustrated as a MOSFET (Metal-Oxide Semiconductor Field Effect Transistor), but the present invention is not necessarily restricted thereto. MOSFET of depletion type or enhancement type can be used.

Moreover, a silicone bipolar transistor is used as the bipolar transistor Q2 of the third and fourth embodiments. However, the invention is not necessarily restricted to the silicon bipolar transistor. When an HBT (Hetero-Bipolar Transistor) comprising a compound semiconductor material is used, there is provided an advantage in that the operation voltage can be lowered by selecting the kind of material, so that the value of the control voltage Vref1 can be lowered. In other respects, the present invention can be variously modified and practiced within the scope of not departing from the gist of the invention.

As has been described, when the bias circuit of the transistor for the high frequency power amplification of the present invention is used, an increase in the base current in the operation in the non-linear region of the high frequency input power—output power characteristic of the transistor for the high frequency power amplification at the time of the input of the high frequency signal is not eliminated, so that the temperature compensation of the base current and the collector current can be conducted. Consequently, the thermal runaway of the transistor for the high frequency power amplification resulting from the temperature rise is prevented, and at the same time, a bias circuit of the base voltage of the bipolar transistor for high frequency signal can be provided wherein an increase in the output power of the high frequency signal is large in the operation in the non-linear region of the high frequency input power—output power.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A bias circuit of a bipolar transistor having a temperature characteristic and comprising a diode-connected bipolar transistor having a temperature characteristic substantially the same as said bipolar transistor, a field effect transistor, a first resistor and a second resistor;

wherein an emitter of the diode-connected bipolar transistor is grounded;

a collector and a base of the diode-connected bipolar transistor are connected to each other, and a connection point between the collector and the base of the diode-connected bipolar transistor is connected to one terminal of the first resistor and a gate of the field effect transistor;

a control voltage is applied to the other terminal of the first resistor;

a source of the field effect transistor is connected to one terminal of the second resistor;

the other terminal of the second resistor is grounded;

a reference voltage is applied to a drain of the field effect transistor; and an output terminal is connected to the source of the field effect transistor, and a bias voltage is adapted to be output from the source of the field effect transistor via the output terminal.

2. A bias circuit of a bipolar transistor having a temperature characteristic and comprising a diode having a temperature characteristic substantially the same as said bipolar transistor, a field effect transistor, a first resistor and a second resistor;

wherein a cathode of the diode is grounded;

an anode of the diode is connected to one terminal of the first resistor;

a control voltage is applied to the other terminal of the first resistor;

a connection point between the anode of the diode and said one terminal of the first resistor is connected to a gate of the field effect transistor;

a source of the field effect transistor is connected to one terminal of the second resistor;

the other terminal of the second resistor is grounded;

a reference voltage is applied to a drain of the field effect transistor; and an output terminal is connected to the source of the field effect transistors and a bias voltage is adapted to be output from the source of the field effect transistor via the output terminal.

3. A bias circuit of a bipolar transistor having a temperature characteristic and comprising a first diode-connected bipolar transistor having a temperature characteristic substantially the same as said bipolar transistor and a second bipolar transistor, a first resistor and a second resistor;

wherein an emitter of the first bipolar transistor is grounded;

a collector and a base of the first bipolar transistor are connected to each other, and a connection point between the collector and the base of the first bipolar transistor is connected to one terminal of the first resistor and a base of the second bipolar transistor;

a control voltage is applied to the other terminal of the first resistor;

an emitter of the second bipolar transistor is connected to one terminal of the second resistor;

the other terminal of the second resistor is grounded;

a reference voltage is applied to a collector of the second bipolar transistor; and an output terminal is connected to the emitter of the second bipolar transistor, and a bias voltage is adapted to be output from the emitter of the second bipolar transistor via the output terminal.

4. A bias circuit of a bipolar transistor having a temperature characteristic and comprising a diode having a temperature characteristic substantially the same as said bipolar transistor, another bipolar transistor, a first resistor and a second resistor;

wherein a cathode of the diode is grounded;

an anode of the diode is connected to one terminal of the first resistor;

a control voltage is applied to the other terminal of the first resistor;

a connection point between the anode of the diode and said one terminal of the first resistor is connected to a base of said another bipolar transistor;

an emitter of said another bipolar transistor is connected to one terminal of the second resistor;

the other terminal of the second resistor is grounded;

a reference voltage is applied to a collector of said another bipolar transistor; and an output terminal is connected to the emitter of said another bipolar transistor, and a bias voltage is adapted to be output from the emitter of said another bipolar transistor.

5. A bias circuit of a transistor according to claim 1, wherein the field effect transistor is a depletion type field effect transistor.

6. A bias circuit of a transistor according to claim 2, wherein the field effect transistor is a depletion type field effect transistor.

7. A bias circuit of a transistor according to claim 1, wherein the diode-connected bipolar transistor is an NPN transistor, and the field effect transistor is an N-channel transistor.

8. A bias circuit of a transistor according to claim 2, wherein the field effect transistor is an N channel transistor.

9. A bias circuit of a transistor according to claim 3, wherein the first diode-connected bipolar transistor is an NPN transistor, and the second bipolar transistor is an NPN transistor.

10. A bias circuit of a transistor according to claim 4, wherein said another bipolar transistor is an NPN transistor.

11. A bias circuit of a transistor according to claim 7, wherein the field effect transistor is a depletion type field effect transistor.

12. A bias circuit of a transistor according to claim 8, wherein the field effect transistor is a depletion type field effect transistor.

* * * * *